United States Patent

Ogawa

[11] Patent Number: 6,013,925
[45] Date of Patent: Jan. 11, 2000

[54] CCD-TYPE SOLID-STATE PICKUP DEVICE AND ITS FABRICATION METHOD

[75] Inventor: Chihiro Ogawa, Tokyo, Japan

[73] Assignee: NEC Corporation, Japan

[21] Appl. No.: 08/940,186

[22] Filed: Sep. 30, 1997

[30] Foreign Application Priority Data

Oct. 2, 1996 [JP] Japan .................. 8-262142

[51] Int. Cl.[7] .................. H01L 27/148; H01L 29/768
[52] U.S. Cl. .................. 257/232; 257/233; 257/249; 257/250; 257/435
[58] Field of Search .................. 257/232, 233, 257/249, 250, 435

[56] References Cited

U.S. PATENT DOCUMENTS

| | | | |
|---|---|---|---|
| 5,306,926 | 4/1994 | Yonemato | 257/432 |
| 5,371,397 | 12/1994 | Maegawa et al. | 252/432 |
| 5,493,143 | 2/1996 | Hokari | 257/432 |
| 5,514,887 | 5/1996 | Hokari | 257/222 |
| 5,578,842 | 11/1996 | Shinji | 257/223 |
| 5,585,653 | 12/1996 | Nakashiba | 257/232 |
| 5,619,049 | 4/1997 | Kim | 257/223 |
| 5,844,289 | 12/1998 | Terrnisha et al. | 257/432 |
| 5,844,290 | 2/1998 | Furumiya | 257/432 |

FOREIGN PATENT DOCUMENTS

| | | | |
|---|---|---|---|
| 4-291965 | 10/1992 | Japan | H01L 27/148 |
| 07161957 | 6/1995 | Japan | H01L 27/148 |

*Primary Examiner*—Ngân V. Ngô
*Attorney, Agent, or Firm*—Hayes, Soloway, Hennessey, Grossman & Hage, P.C.

[57] ABSTRACT

A first silicon oxide film, silicon nitride film, and polycrystalline silicon film are formed on the entire surface of a semiconductor substrate. Then, the polycrystalline silicon film is etched to form a first transfer electrode and then, the surface of the first transfer electrode is thermally oxidized to form a second silicon oxide film. Thereafter, a polycrystalline silicon film and a third silicon oxide film are formed on the entire surface and patterned to form a second transfer electrode. A fourth silicon oxide film is formed on the entire surface, and is etched back. Thereafter, the side wall surfaces of the third silicon oxide film and the second transfer electrode are covered with a fourth silicon oxide film. Thereafter, a light shielding film is selectively formed on them.

8 Claims, 11 Drawing Sheets

CCD-TYPE SOLID-STATE PICKUP DEVICE AND ITS FABRICATION METHOD

BACKGROUND OF THE INVENTION

1. Field of the Invention

The present invention relates to a CCD-type solid-state pickup device and its fabrication method capable of decreasing the number of smear signals to be generated.

2. Description of the Prior Art

In the case of a CCD(Charge Coupled Device)-type solid-state pickup device, when a high-luminance object is present in a pickup screen, a false signal referred to as smear may be generated in the region.

FIG. 1 is a sectional view showing the structure of a conventional solid-state pickup device. Hereafter, this is referred to as the first prior art. A P-well layer 2 is formed at the surface of an N-type semiconductor substrate 1. An N-type impurity layer 3 serving as a light-receiving section is selectively formed at the surface of the P-well layer 2. Moreover, an N-well layer 4 serving as an electric-charge transfer section is formed at the surface of the P-well layer 2 in the region where the N-type impurity layer 3 is not formed. A P$^+$ impurity layer 5 for isolating a device is formed at the both sides of a set of N-well layer 4 and N-type impurity layer 3.

Moreover, a gate insulating film 6 is selectively formed on the substrate 1 in the region where the N-type impurity layer 3 is not formed, and a polycrystalline silicon gate electrode 7 is formed on the gate insulating film 6. A silicon oxide film 8 is formed on the upside and the side-wall of the polycrystalline silicon gate electrode 7 and the surface of the N-type impurity layer 3. A CVD oxide film 9 is formed on the entire surface of them. A light shielding film 10 made of aluminum or the like is formed on the CVD film 9 except some regions above the N-type impurity layer 3. Moreover, a surface protective film 11 made of a CVD insulating film is formed on the entire surface of them.

In the case of a solid-state pickup device thus constituted, particularly a diagonally-incoming incident ray 12 among the rays coming into the N-type impurity layer 3 serving as a light receiving section reflects on the surface of the N-type impurity layer 3 and the interface between the light shielding film 10 and the CVD oxide film 9. Then, the incident ray 12 is introduced into the N-well layer 4 serving as an electric-charge transfer section. As a result, the introduced incident ray is photoelectrically transferred to an electric charge and the electric charge is added to an original signal as a false signal. Because the false signal is superimposed on every signal electric-charge group in the N-well layer 4, a linear smear signal appears on a screen.

Therefore, a solid-state pickup device for decreasing the generation of the smear signal is disclosed in Japanese Examined Patent Publication (Koukai) No. Heisei 7-161957. Hereafter, this is referred to as the second conventional example. FIGS. 2A and 2B are sectional views showing a method for fabricating the solid-state pickup device of the second prior art in order of fabrication step. First, the structure of the solid-state pickup device of the second prior art is described below by referring to FIG. 2B. In the second prior art shown in FIG. 2B, a component same as that shown in FIG. 1 is provided with the same symbol and its detailed description is omitted.

As shown in FIG. 2B, in the case of the second prior art, a first protective film 13a made of a silicon nitride film is formed on the upside of the polycrystalline silicon gate electrode 7. Moreover, a second protective film 13b made of a silicon nitride film is formed on the side wall surface of the polycrystalline silicon gate electrode 7.

Then, a method for fabricating the solid-state pickup device of the second prior art is described below. As shown in FIG. 2A, the P-well layer 2 is first formed at the surface of the N-type semiconductor substrate 1. Then, the N-type impurity layer 3, N-well layer 4, and P$^+$ impurity layer 5 are selectively formed at the surface of the P-well layer 2. Then, an insulating film (not shown), a polycrystalline silicon film (not shown), and a first silicon nitride film (not shown) are formed on the entire surface in order. Thereafter, the first protective film 13a, polycrystalline silicon gate electrode 7, and gate insulating film 6 are formed by using a resist film patterned into a predetermined shape as a mask and thereby, etching the first silicon nitride film, polycrystalline silicon film, and insulating film. Then, the silicon oxide film 8 is formed by thermally oxidizing the surface of the N-type impurity layer 3 at the surface of the semiconductor substrate 1. The silicon oxide film 8 has a thickness of, for example, 80 nm.

Thereafter, as shown in FIG. 2B, the second protective film 13b is formed on side wall surfaces of the polycrystalline silicon gate electrode 7 and the protective film 13a by forming a second silicon nitride film (not shown) on the entire surface of them and anisotropically etching the film. Thereafter, the CVD oxide film 9 for insulating the polycrystalline silicon gate electrode 7 from a light shielding film to be formed later is formed at a thickness of, for example, 150 nm on the entire surface of them. Thereafter, the light shielding film 10 is formed on the CVD oxide film 9 except some regions above the N-type impurity layer 3. Thereafter, the surface protective film 11 is formed on the entire surface of them.

In the case of a solid-state pickup device thus constituted, the top and side wall surfaces of the gate electrode 7 are covered with the protective films 13a and 13b respectively made of a silicon nitride film having a function of absorbing light. Therefore, even if the incident ray 12 diagonally coming into the N-type impurity layer 3 reflects on the surface of the N-type impurity layer 3 and the interface between the light shielding film 10 and the CVD oxide film 9 and then, reaches the protective films 13a or 13b, the incident ray 12 is absorbed by these protective films. Therefore, it is possible to prevent the light from introducing into the N-well layer 4 serving as an electric-charge transfer section and thereby, decrease the number of smear signals to be generated.

However, a CCD-type solid-state pickup device may have a transfer electrode made of polycrystalline silicon of at least two layers. Therefore, when fabricating a solid-state pickup device having a transfer electrode of two layers or more by the above fabrication method, problems occur that the number of fabrication steps increases and moreover, the fabrication cost increases. That is, the number of fabrication steps increases because it is necessary to perform the step of forming a silicon nitride film twice and the step of forming the protective film 13b by etching back a second silicon nitride film once whenever forming a one-layer transfer electrode.

Moreover, because a silicon nitride film has a function of absorbing light, a ray coming into a light-receiving section may be absorbed by the silicon nitride film if the silicon nitride film remains on a silicon oxide film on the N-type impurity layer 3. Therefore, to form a transfer electrode of two layers or more, a first-layer transfer electrode is formed and then, a silicon nitride film is formed on the entire surface and a protective film is formed on the side wall surface of a transfer electrode by etching back the silicon nitride film. In this case, it is necessary to completely remove the silicon nitride film from the surface of the light-receiving section. Therefore, to form a protective film on the side wall surface of the first-layer transfer electrode, it is necessary to over-etch the silicon nitride film formed above the N-type impurity layer 3. However, the thickness of a gate insulating film located under the second-layer transfer electrode is easily fluctuated due to the fluctuation in the etching rate of the silicon nitride film. As a result, the channel potential becomes unstable and a trouble occurs when electric charges are transferred.

SUMMARY OF THE INVENTION

It is the first object of the present invention to provide a CCD-type solid-state pickup device and its fabrication method capable of decreasing the number of smear signals to be generated and decreasing the number of fabrication steps and thereby, fabricating the device at a low cost. Moreover, it is the second object of the present invention to provide a stably-operable CCD-type solid-state pickup device and its fabrication method.

A solid-state pickup device of the present invention has a semiconductor substrate. A light-receiving section and a channel region are separately formed at the surface of the semiconductor substrate. A first insulating film is formed on the semiconductor substrate. A plurality of electric-charge transfer electrodes are formed on the first insulating film on the channel region. The electric-charge transfer electrodes are arranged along the direction in which electric charges are transferred. A second insulating film is formed on the top surface of the electric-charge transfer electrodes. A third insulating film is formed on the side wall surfaces of the electric-charge transfer electrodes and the second insulating film. A light shielding film is formed on the second insulating film present above the channel region and on the side wall surface of the third insulating film. The end of the light shielding film extends above the light-receiving section and the distance between the bottom of the light shielding film above the light-receiving section and the light-receiving section is 200 nm or less.

Another CCD-type solid-state pickup device of the present invention has a first electric-charge transfer electrode selectively formed on the first insulating film. The first electric-charge transfer electrode is covered with a second insulating film. A second electric-charge transfer electrode is selectively formed on the first and second insulating films. The channel region is located under the first and second electric-charge transfer electrodes. A third insulating film is formed on the top surface of the second electric-charge transfer electrode. A fourth insulating film is formed on the side wall surfaces of the second electric-charge transfer electrode and the third insulating film. A light shielding film is formed on the third insulating film above the channel region and the side wall surface of the fourth insulating film. The end of the light shielding film extends above the light-receiving section and the distance between the bottom of the light shielding film above the light-receiving section and the light-receiving section is 200 nm or less.

Still another CCD-type solid-state pickup device of the present invention has a second insulating film selectively formed only on the top surface of the electric-charge transfer electrode to insulate the electric-charge transfer electrode from the light shielding film. A side-wall insulating film is formed on the side wall surface of the electric-charge transfer electrode to insulate the electric-charge transfer electrode from the light shielding film.

It is permitted that the end of the light shielding film extends above the light-receiving section. In this case, it is possible to set the distance between the bottom of the light shielding film above the light-receiving section and the light-receiving section to 200 nm or less. Moreover, it is preferable that the distance between the bottom of the light shielding film above the light-receiving section and the light-receiving section is 110 nm or less.

In the case of a CCD-type solid-state pickup device fabrication method of the present invention, second-conducting-type impurities are introduced into the surface of a first-conducting-type semiconductor substrate to form a channel region. Then, a first insulating film is formed on the semiconductor substrate. Then, a conductive film is formed on the first insulating film. Thereafter, a second insulating film is formed on the conductive film. Thereafter, the second insulating film and the conductive film are patterned into a predetermined shape to form an electric-charge transfer electrode. Thereafter, a third insulating film is formed on the entire surface. Thereafter, the third insulating film is etched back. In this etching-back step, the third insulating film remains on the side wall surfaces of the electric-charge transfer electrode and the second insulating film.

In the case of another CCD-type solid-state pickup device fabrication method of the present invention, a second insulating film is formed on the first insulating film and thereafter, a first conductive film is formed. Then, the first conductive film is patterned into a predetermined shape to form a first electric-charge transfer electrode. Thereafter, the surface of the first electric-charge transfer electrode is thermally oxidized to form a third insulating film on the top and the side wall surfaces of the first electric-charge transfer electrode. Thereafter, a second conductive film and a fourth insulating film are formed on the entire surface in order. Thereafter, the fourth insulating film, second conductive film, and second insulating film are patterned into a predetermined shape to selectively form a second electric-charge transfer electrode on the second and the third insulating films. Thereafter, a fifth insulating film is formed on the side wall surfaces of the second electric-charge transfer electrode and the fourth insulating film.

In the case of still another CCD-type solid-state pickup device fabrication method of the present invention, a fifth insulating film is formed on the fourth insulating film. Then, the fifth insulating film, the fourth insulating film, and the second conductive film are patterned into a predetermined shape to selectively form a second electric-charge transfer electrode on the second and the third insulating films. Thereafter, a sixth insulating film is formed on the entire surface. Thereafter, the sixth insulating film is etched back to expose the second insulating film and the fifth insulating film. Thereafter, the regions where the second and fifth insulating films are exposed are removed through etching.

These solid-state pickup device fabrication methods have the step of forming a light-receiving section at the surface of the semiconductor substrate and the step of forming a light shielding film above a channel region. In this case, the end of the light shielding film extends above the light-receiving section and it is possible to set the distance between the bottom of the light shielding film above the light-receiving section and the light-receiving section to 200 nm or less.

The present invention does not need to perform the step of forming a silicon nitride film twice whenever forming one-layer electric-charge transfer electrode. Moreover, the present invention has the step of etching back only an insulating film for insulating an electric-charge transfer electrode which is a topmost layer from the light shielding film, when forming a solid-state pickup device having a multilayer electric-charge transfer electrode. Therefore, the present invention makes it possible to decrease the number of fabrication steps and thereby, reduce the fabrication cost.

Moreover, in the case of the present invention, the insulation between the electric-charge transfer electrode and the light shielding film is maintained because the top surface and the side wall surface of the electric-charge transfer electrode are covered with an insulating film. Furthermore, it is possible to greatly decrease the distance between the light-receiving section and the light shielding film compared to the case of a conventional solid-state pickup device. Therefore, even if an incident ray is diagonally applied to the light-receiving section, the incident ray is not easily applied to the channel region and therefore, it is possible to decrease the number of smear signals to be generated.

Moreover, by setting the distance between the light-receiving section and the bottom of the light shielding film to 200 nm or less, it is possible to decrease the number of smear signals to be generated compared to the case of a conventional solid-state pickup device. Furthermore, by setting the distance to 110 nm or less, a higher advantage can be obtained.

DESCRIPTION OF THE PREFERRED EMBODIMENTS

Figure 1:
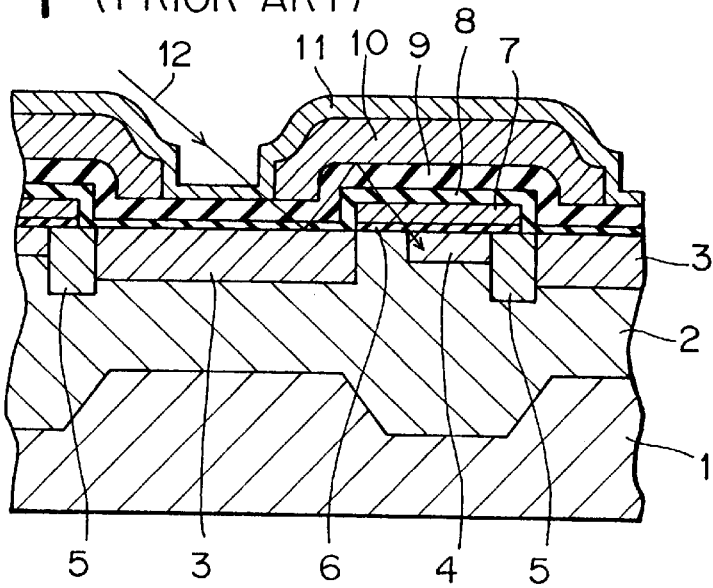
FIG. 1 is a sectional view showing the structure of a conventional solid-state pickup device.
Figure 2A:
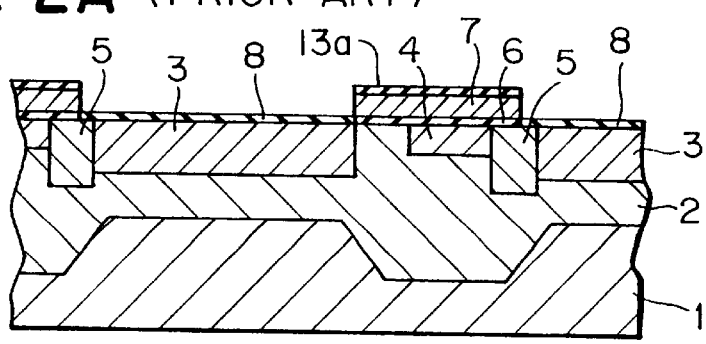
FIGS. 2A and 2B are sectional views showing a method for fabricating the solid-state pickup device of the second prior art in order of fabrication step.
Figure 2B:
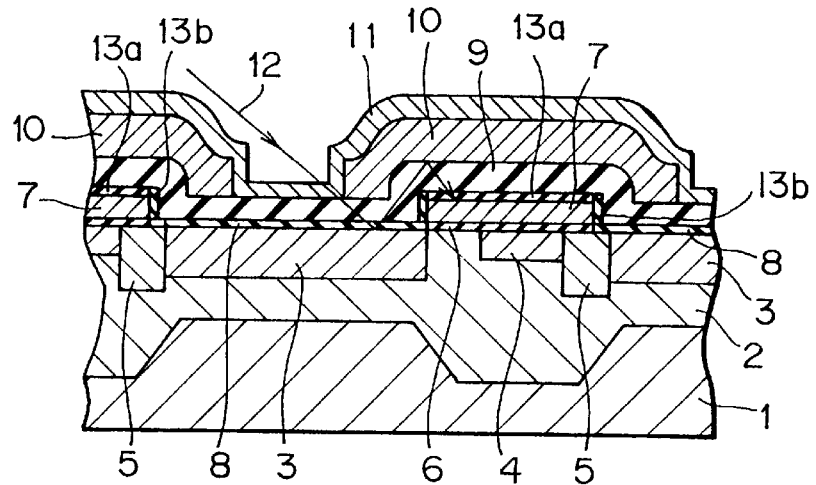
Figure 3:
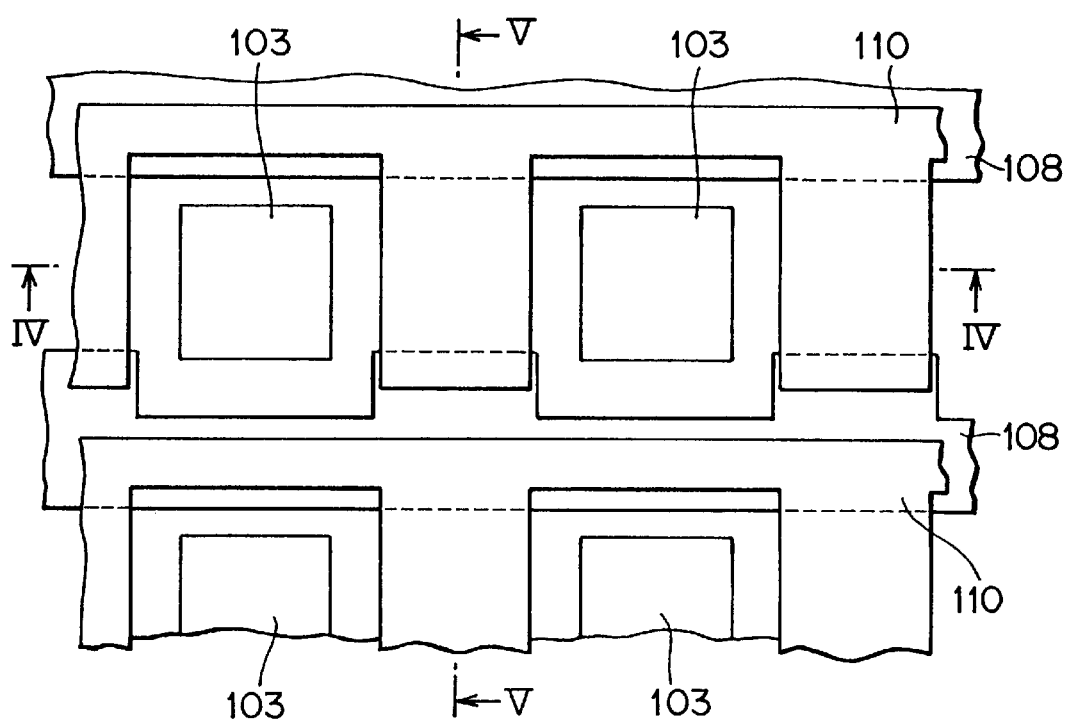
FIG. 3 is a top view showing the solid-state pickup device of the first embodiment of the present invention.
Figure 4:
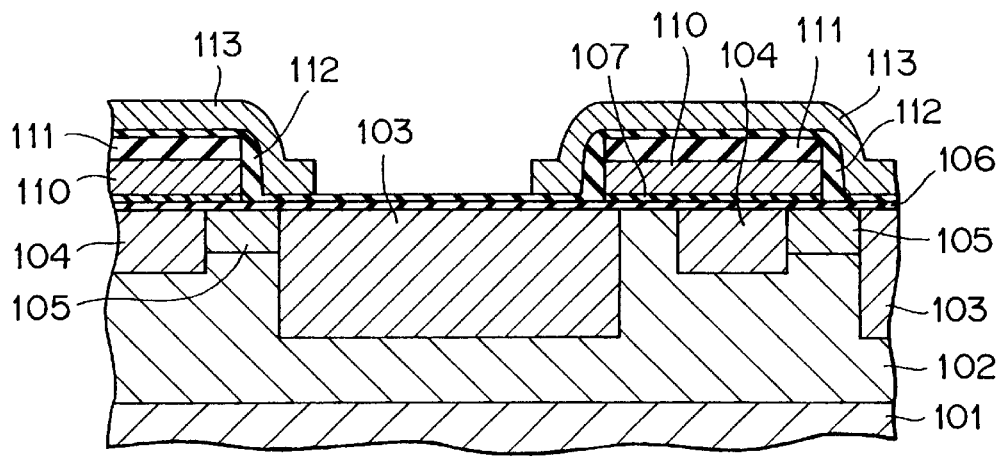
FIG. 4 is a sectional view along the line IV—IV in FIG. 3.
Figure 5:
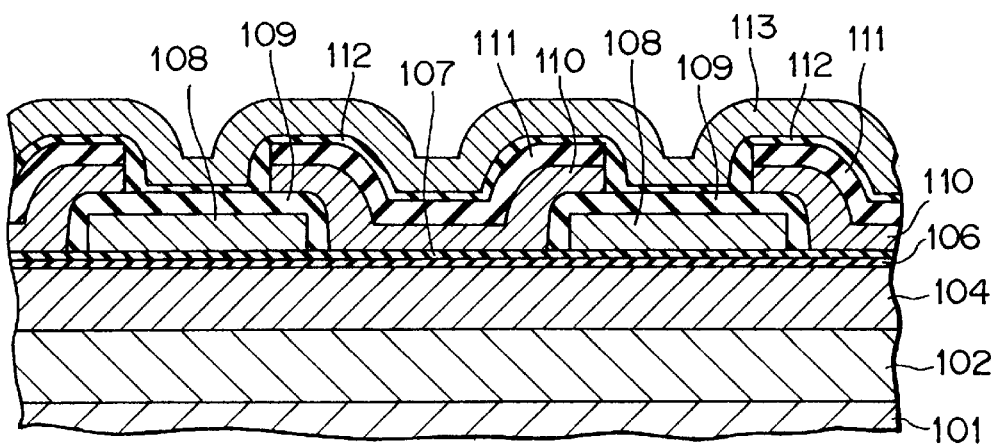
FIG. 5 is a sectional view along the line V—V in FIG. 3.

The preferred embodiments of the present invention are described below by referring to the accompanying drawings. FIG. 3 is a top view showing the solid-state pickup device of the first embodiment of the present invention. FIG. 4 is a sectional view along the line IV—IV in FIG. 3, and FIG. 5 is a sectional view along the line V—V in FIG. 3. It should be noted that, FIG. 3 shows only an N-type light-receiving region 103, a first transfer electrode 108, and a second transfer electrode 110 shown in FIGS. 3, 4, and 5.

As shown in FIGS. 3 to 5, a P-well 102 is formed at the surface of an N-type silicon substrate 101. An N-type light-receiving region 103 is selectively formed at the surface of the P-well 2. Moreover, an electric-charge transfer region (channel region) 104 is selectively formed at the surface of the P-well 2 in the region where N-type light-receiving region 103 is not formed. A device isolation region 105 is formed at the both sides of a set of the electric-charge transfer region 104 and the N-type light-receiving regions 103. It should be noted that, the N-type light-receiving region 103 is formed at a position deeper than the electric-charge transfer region 104 and the device isolation region 105 is formed at a position shallower than the electric-charge transfer region 104.

Furthermore, a first silicon oxide film 106 is formed on the entire surface of the N-type silicon substrate 101. A silicon nitride film 107 is selectively formed on the first silicon oxide film 106 above the region where the N-type light-receiving region 103 is not formed and the first transfer electrode 108 is selectively formed on the silicon nitride film 107. A second silicon oxide film 109 is formed on the top and side wall surfaces of the first transfer electrode 108.

Moreover, a second transfer electrode 110 is formed on the silicon nitride film 107 above the region where the N-type light-receiving region 103 is not formed so as to cover a part of a second silicon oxide film 109. A third silicon oxide film 111 is formed on the top surface of the second transfer electrode 110. Furthermore, a fourth silicon oxide film 112 covering the entire surface of them is formed. That is, the fourth silicon oxide film 112 is formed on the surface of the first silicon oxide film 106 above the N-type light-receiving region 103, on the side wall surfaces of the silicon nitride film 107, second transfer electrode 110, and third silicon oxide film 111, on the top surface of the third silicon oxide film 111, and on the top surface of the second silicon oxide film 109 not covered with the second transfer electrode 110. The thickness of the fourth silicon oxide film 112 formed on the side wall surfaces of the second transfer electrode 110 and third silicon oxide film 111 is larger than that of the fourth silicon oxide film 112 formed on the other region. Moreover, a light shielding film 113 is formed on the entire surface of them except the upper region of the N-type light-receiving region 103.

Figure 6A:
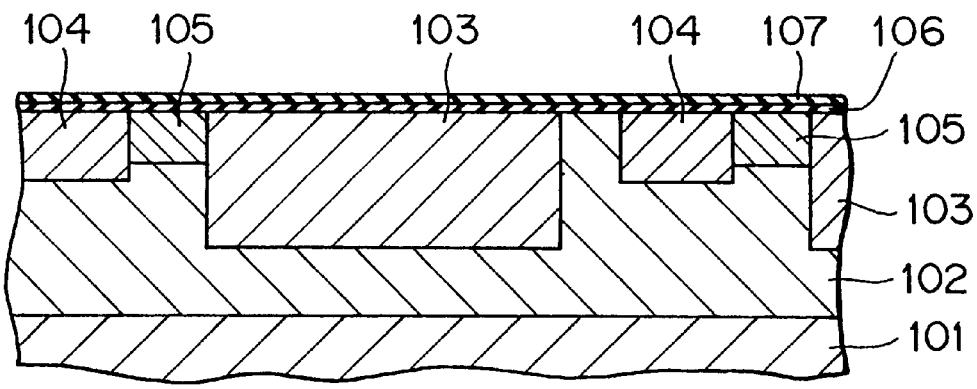
FIGS. 6A and 6B are sectional views showing a method for fabricating the solid-state pickup device of the first embodiment of the present invention in order of fabrication step.
Figure 6B:
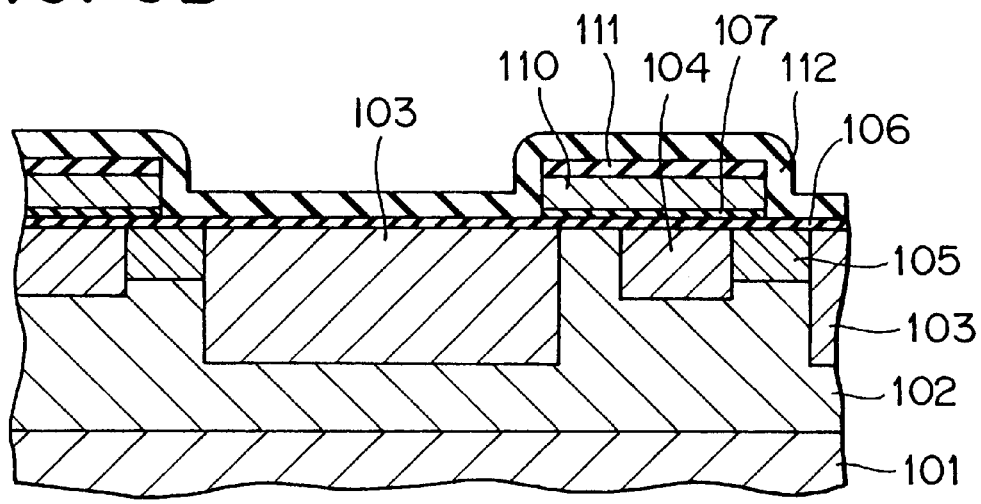
Figure 7A:
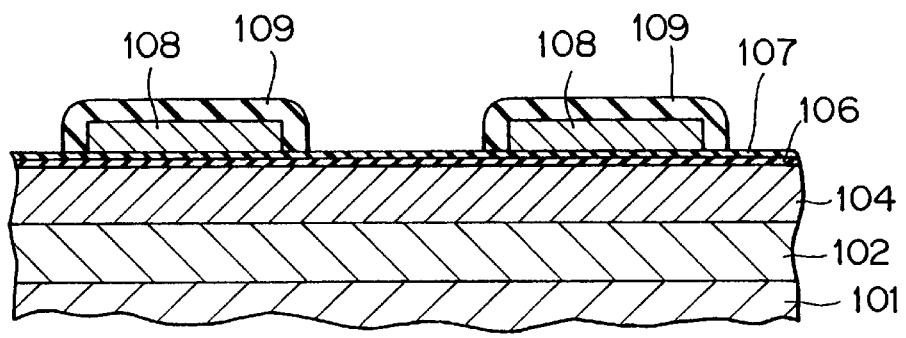
FIGS. 7A and 7B are sectional views showing a method for fabricating the solid-state pickup device of the first embodiment of the present invention in order of fabrication step.
Figure 7B:
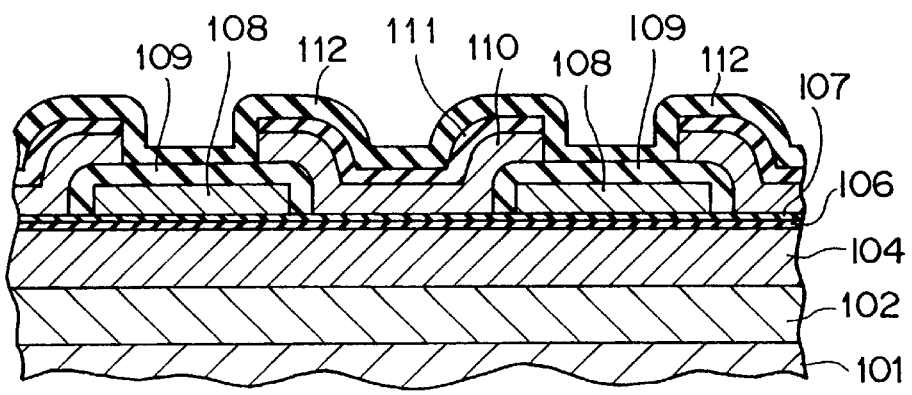

Then, a method for fabricating a solid-state pickup device having the above structure is described below. FIGS. 6A and 6B and FIGS. 7A and 7B are sectional views showing a method for fabricating the solid-state pickup device of the first embodiment of the present invention in order of fabrication step. It should be noted that, FIGS. 6A and 6B show the sectional views in the direction along the line IV—IV in FIG. 3, and FIGS. 7A and 7B show the sectional views in the direction along the line V—V in FIG. 3.

As shown in FIG. 6A, the P-well 102 is first formed at the surface of the N-type silicon substrate 101. Then, the N-type light-receiving region 103, the electric-charge transfer region 104, and the device isolation region 105 are selectively formed at the surface of the P-well 102 in a predetermined shape respectively. These regions 103, 104, and 105 can be formed by using a photoresist film patterned into a predetermined shape as a mask to implant ions into the surface of the substrate 101 and thereafter, thermally treating the substrate.

Then, the first silicon oxide film 106 is formed on the entire surface of the N-type silicon substrate 101 at a thickness of, for example, 50 nm and the silicon nitride film 107 is formed on the first silicon oxide film 106 at a thickness of, for example, 20 nm. Thereafter, a polycrystalline silicon film (not shown) is deposited on the silicon nitride film 107 at a thickness of, for example, 200 to 500 nm. The polycrystalline silicon film is doped with impurities such as phosphorus at a concentration of $1 \times 10^{18}$ to $5 \times 10^{20}$ (atoms/cm$^2$).

Thereafter, as shown in FIG. 7A, the first transfer electrode 108 is formed by using a photoresist film (not shown) patterned into a predetermined shape as a mask and thereby etching the polycrystalline silicon film. Thereafter, the second silicon oxide film 109 is formed by thermally oxidizing the surface of the first transfer electrode 108. It is also possible to form a thin silicon oxide film on the surface of the silicon nitride film 107 before the step of depositing the polycrystalline silicon film. Thus, it is possible to use the thin silicon oxide film as an etching barrier when etching the polycrystalline silicon film. In the shown embodiment, because the silicon nitride film 107 is formed on the surface of the first transfer electrode 106, it is possible to prevent the thickness of the first silicon oxide film 106 from increasing when thermally oxidizing the surface of the first transfer electrode 108.

Thereafter, as shown in FIGS. 6B and 7B, a polycrystalline silicon film (not shown) doped with phosphorus is deposited on the entire surface of them at a thickness of 50 to 300 nm. Thereafter, a third silicon oxide film 111 is formed on the polycrystalline silicon film by, for example, the CVD process. Thereafter, the third silicon oxide film 111, polycrystalline silicon film, and silicon nitride film 107 are etched by using a photoresist film (not shown) patterned into a predetermined shape as a mask. Thereby, the second transfer electrode 110 made of polycrystalline silicon is formed. Thereafter, the fourth silicon oxide film 112 is formed on the entire surface of them at a thickness of 100 to 500 nm.

Thereafter, as shown in FIGS. 4 and 5, the fourth silicon oxide film 112 is etched back. In this case, an etching degree is selected so that the fourth silicon oxide film 112 formed on the region other than the side wall surfaces of the third silicon oxide film 111 and the second transfer electrode 110 slightly remains. For example, when the etching rate is maximized, it is possible to select a condition in which the fourth silicon oxide film 112 on the surfaces of the third silicon oxide film 111, second silicon oxide film 109, and first silicon oxide film 106 is just etched.

Specifically, when the thickness of the fourth silicon oxide film 112 is 300 nm and the etching rate of the silicon oxide film 112 is 80 to 100 (nm/min), it is possible to set the etching time to 3 min. Thus, when the etching rate is maximized (100 (nm/min)), the silicon oxide film 112 is just etched. Therefore, when the etching rate is maximized, the thickness of the silicon oxide film 112 remaining on the surface of the first silicon oxide film 106 or the like becomes 0 nm. When the etching rate is minimized, the thickness of the silicon oxide film 112 remaining on the surface of the first silicon oxide film 106 or the like becomes 60 nm.

Thereafter, a metallic film (not shown) made of aluminum and tungsten and so forth is deposited on the entire surface of them at a thickness of, for example, 200 nm to 1 μm. It is possible to select a film made of a metal having a superior light shielding property as the metallic film. Thereafter, the light shielding film 113 is formed by using a photoresist film (not shown) patterned into a predetermined shape as a mask and thereby removing a metallic film above the N-type light-receiving region 103 through etching. Thereby, it is possible to obtain a CCD-type solid-state pickup device having the structure shown in FIGS. 3 to 5.

In the case of the first embodiment thus constituted, it is unnecessary to perform the step of forming a silicon nitride film twice whenever forming a one-layer transfer electrode. Moreover, in the case of a prior art, it is necessary to perform the step of etching back a silicon nitride film once whenever forming a one-layer transfer electrode. In the case of this embodiment, however, only the fourth silicon oxide film 112 for insulating the second transfer electrode 110 which is the topmost layer from the light shielding film 113 is etched back. Therefore, this embodiment makes it possible to decrease the number of fabrication steps compared to the case of a conventional solid-state pickup device and thereby, reduce the fabrication cost.

Moreover, in the case of the first embodiment, the third silicon oxide film 111 is formed on the top surface of the second transfer electrode 110 and moreover, the fourth silicon oxide film 112 is formed on the side wall surface of the second transfer electrode 110. Moreover, the insulation between the second transfer electrode 110 and the light shielding film 113 is kept only by the third and fourth silicon oxide films 111 and 112 and the parasitic capacitance of the electrode decreases. Therefore, in the case of this embodiment, it is unnecessary to form the CVD oxide film 9 for insulating a transfer electrode from a light shielding film differently from the case of the second prior art.

That is, in the case of this embodiment, only the first silicon oxide film 106 or only the first silicon oxide film 106 and fourth silicon oxide film 112 is or are present between the N-type light-receiving region 103 and the light shielding film 113. Moreover, the thicknesses of the silicon oxide films 106 and 112 (50 to 110 nm) are much smaller than the thicknesses of the CVD oxide film 9 and silicon oxide film 8 (230 nm) of the solid-state pickup device of the second prior art. As a result, the distance between the N-type light-receiving region 103 and the light shielding film 113 decreases. Therefore, even if an incident ray is diagonally applied to the N-type light-receiving region, the incident ray is not easily directly applied to the electric-charge transfer region 104 and therefore, it is possible to decrease the number of smear signals to be generated.

Moreover, by setting the distance between the N-type light-receiving region 103 and the light shielding film 113 to 200 nm or less, it is possible to decrease the number of smear signals to be generated compared to the case of a conventional solid-state pickup device. Furthermore, by setting the distance to 110 nm or less, a higher advantage can be obtained.

Thus, the first embodiment makes it possible to decrease the number of fabrication steps and thereby, it is possible to provide a CCD-type solid-state pickup device capable of decreasing the number of smear signals to be generated at a low cost.

In the case of the first embodiment, a solid-state pickup device having a two-layer transfer electrode and its fabrication method are illustrated. However, the present invention can be also applied to a solid-state pickup device having a transfer electrode of three layers or more. In this case, only the transfer electrode which is topmost layer is fabricated by the same method as that of the second transfer electrode 110 shown in the first embodiment. Moreover, other transfer electrodes can be fabricated by the same method as that of the first transfer electrode 108 shown in the first embodiment.

Figure 8:
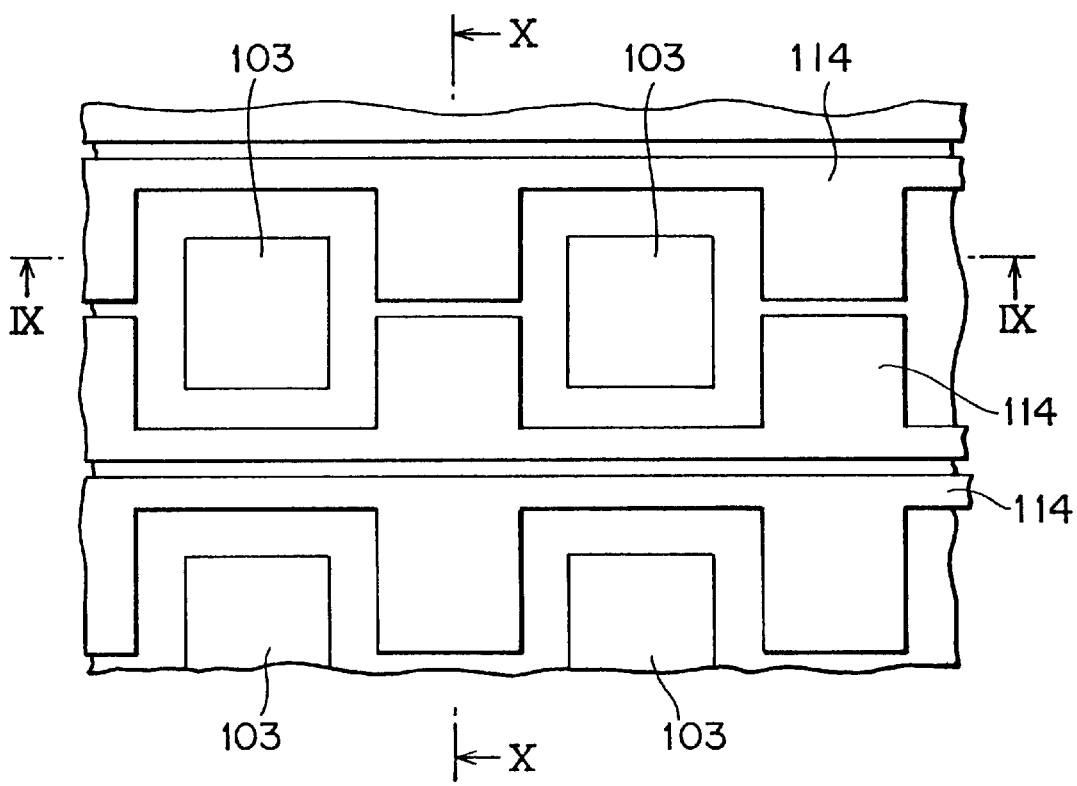
FIG. 8 is a top view showing the solid-state pickup device of the second embodiment of the present invention.
Figure 9:
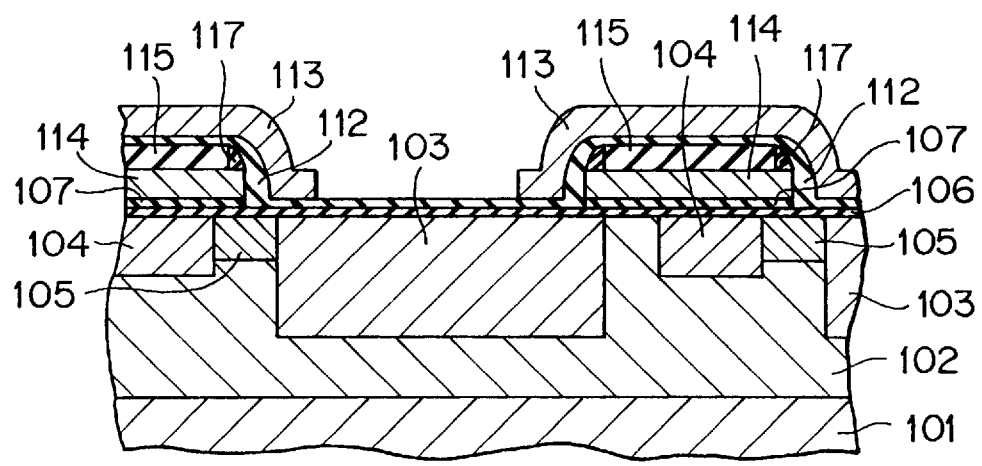
FIG. 9 is a sectional view along the line IX—IX in FIG. 8.
Figure 10:
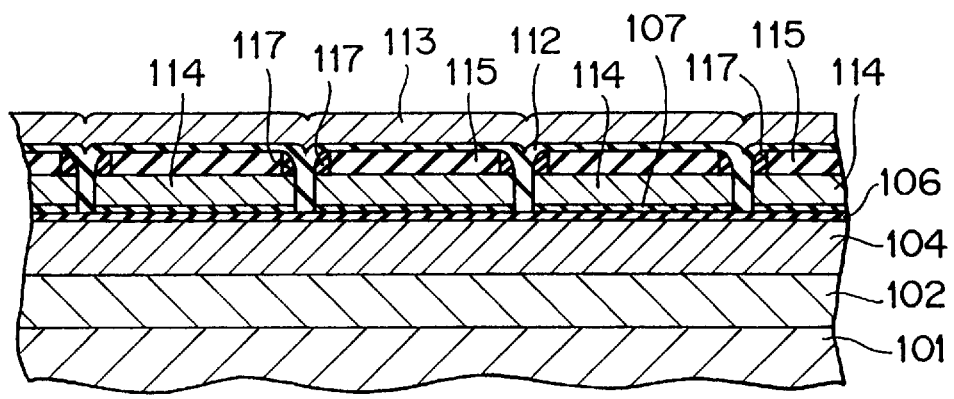
FIG. 10 is a sectional view along the line X—X in FIG. 8.

Then, the solid-state pickup device of the second embodiment of the present invention is described below. FIG. 8 is a top view showing the solid-state pickup device of the second embodiment of the present invention. Moreover, FIGS. 9 is a sectional view along the line IX—IX in FIG. 8, and FIG. 10 is a sectional view along the line X—X in FIG. 8. In the case of the second embodiment shown in FIGS. 8 to 10, a component same as that in FIGS. 3 to 5 is provided with the same symbol and its detailed description is omitted. Moreover, FIG. 8 shows only the N-type light-receiving region 103 and the transfer electrode 114 in FIGS. 9 and 10. That is, in the case of the first embodiment, the second silicon oxide film 109 obtained by oxidizing the surface of the first transfer electrode 108 is formed between the first transfer electrode 108 and the second transfer electrode 110 and thereby, a gap is provided between transfer electrodes. In the case of the second embodiment, however, a gap is provided between transfer electrodes by forming a very small electrode pattern through photolithography.

As shown in FIGS. 8 to 10, the first silicon oxide film 106 is formed on the entire surface of the N-type silicon substrate 101. The silicon nitride film 107 is selectively formed on the surface of the first silicon oxide film 106 and the transfer electrode 114 is formed on the silicon nitride film 107. A second silicon oxide film 115 is formed on the top surface of the transfer electrode 114 in a region slightly narrower than the transfer electrode 114. A third silicon oxide film 117 is formed on the side wall surface of the second silicon oxide film 115.

Moreover, the fourth silicon oxide film 112 is formed on the entire surface of them. In the case of the second embodiment, the fourth silicon oxide film 112 is also formed between the transfer electrodes 114 formed by patterning a one-layer polycrystalline silicon film. Furthermore, the light shielding film 113 is formed on the entire surface except the region above the N-type light-receiving region 103.

Figure 11A:
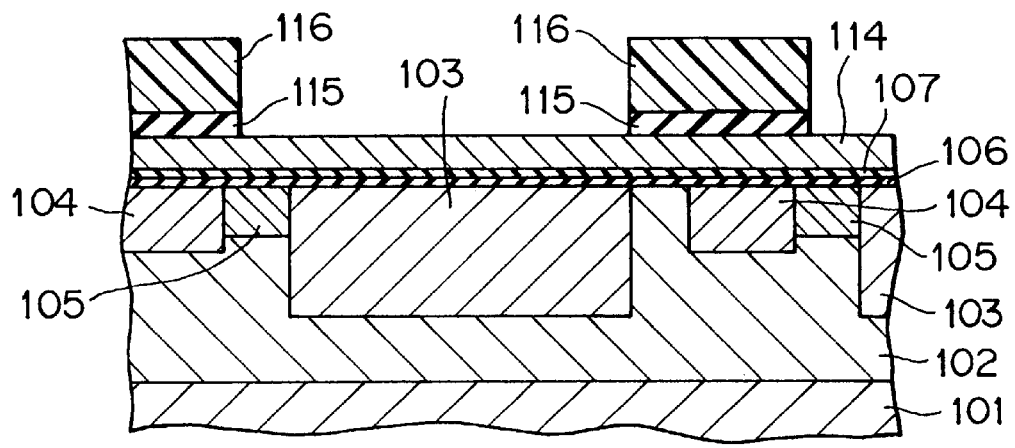
FIGS. 11A and 11B are sectional views showing a method for fabricating the solid-state pickup device of the second embodiment of the present invention in order of fabrication step.
Figure 11B:
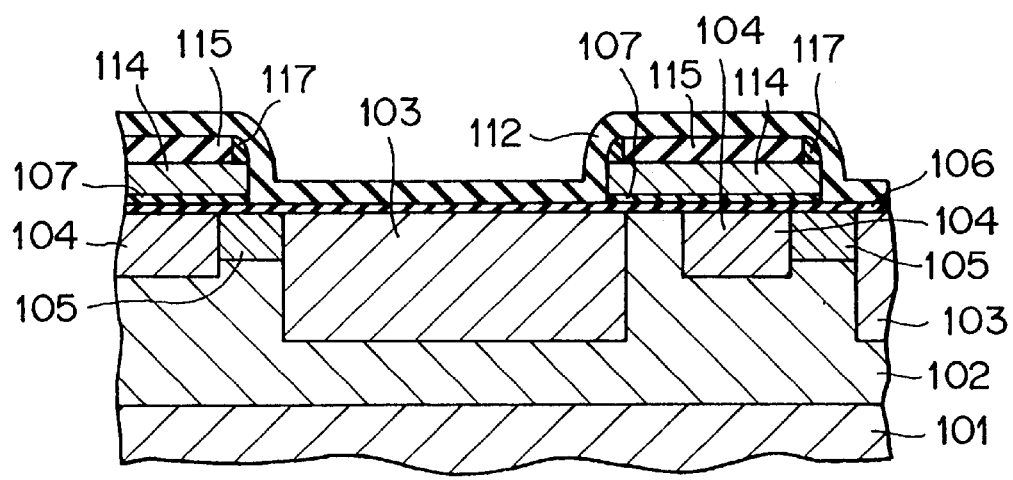
Figure 12A:
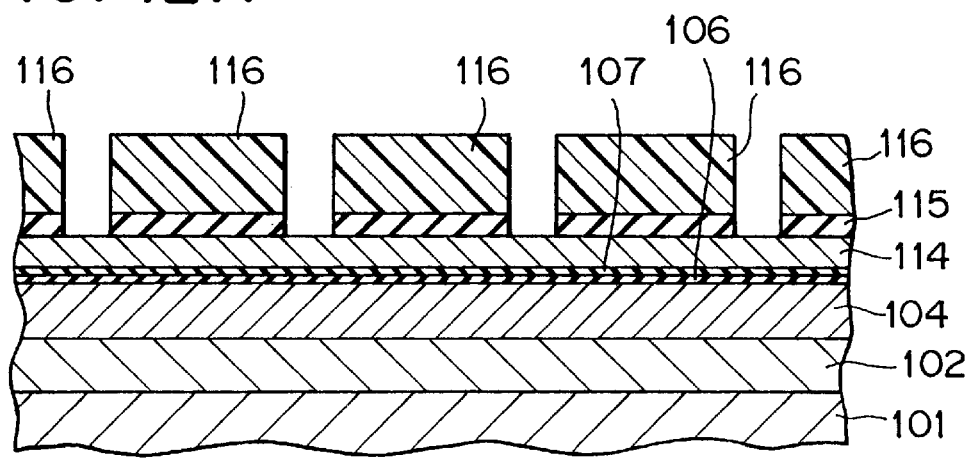
FIGS. 12A and 12B are sectional views showing a method for fabricating the solid-state pickup device of the second embodiment of the present invention in order of fabrication step.
Figure 12B:
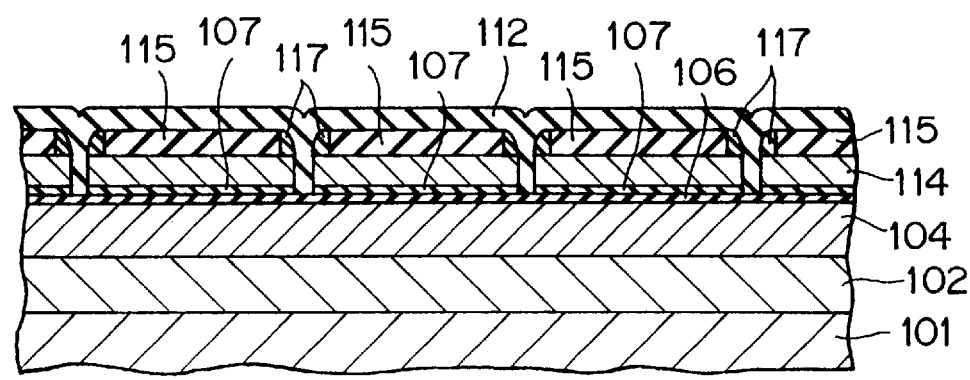

Then, a method for fabricating a solid-state pickup device constituted as described above. FIGS. 11A and 11B and FIGS. 12A and 12B are sectional views showing a method for fabricating the solid-state pickup device of the second embodiment of the present invention in order of fabrication step. FIGS. 11A and 11B show sectional views in the direction along the line IX—IX in FIG. 8, and FIGS. 12A and 12B show sectional views in the direction along the line X—X in FIG. 8.

As shown in FIGS. 11A and 12A, the P-well 102 is formed at the surface of the N-type silicon substrate 101. Then, the N-type light-receiving region 103, the electric-charge transfer region 104, and the device isolation region 105 are selectively formed at the surface of the P-well 102 in a predetermined shape respectively. Then, a first silicon oxide film 106 is formed on the entire surface of the N-type silicon substrate 101 at a thickness of, for example, 50 nm and a silicon nitride film 107 is formed on the first silicon oxide film 106 at a thickness of, for example, 20 nm. Thereafter, a polycrystalline silicon film (not shown) is deposited on the silicon nitride film 107 at a thickness of, for example, 200 to 500 nm. The polycrystalline silicon film is doped with impurities such as phosphorus at a concentration of, for example, $1\times10^{18}$ to $5\times10^{20}$ (atoms/cm$^2$).

Thereafter, a second silicon oxide film 115 is formed on the polycrystalline silicon film at a thickness of 200 to 500 nm by the CVD process or the like. Thereafter, a resist film (not shown) is formed on the second silicon oxide film 115 to form a photoresist film 116 having a predetermined shape by patterning the photoresist film. In this case, the width of a slit between the photoresist films 116 is set to, for example, 0.4 μm. Thereafter, the second silicon oxide film 115 is etched by using the photoresist film 116 as a mask.

Thereafter, as shown in Figs. 11B and 12B, the photoresist film 116 is removed and then, a third silicon oxide film 117 is formed on the entire surface at a thickness of, for example, 100 nm by the low-pressure CVD process. Thereafter, the third silicon oxide film 117 is etched back to remove the third silicon oxide film 117 formed in the region other than the side wall surface of the second silicon oxide film 115. In this case, the slit width between the third silicon oxide films 117 becomes approx. 0.2 μm.

Thereafter, the polycrystalline silicon film and the silicon nitride film 107 are etched by using the second silicon oxide film 115 and the third silicon oxide film 117 as masks. Thereby, a transfer electrode 114 having a slit width of approx. 2 μm is formed. Thereafter, a fourth silicon oxide film 112 is formed on the entire surface of them at a thickness of, for example, 100 to 500 nm. Thereafter, similarly to the case of the first embodiment, a solid-state pickup device having the structure shown in FIGS. 8 to 10 can be obtained by etching back the fourth silicon oxide film 112 and then, forming the light shielding film 113.

Even the second embodiment thus constituted makes it possible to decrease the number of fabrication steps similarly to the case of the first embodiment.

Moreover, the second and third silicon oxide films 115 and 117 are formed on the top surface of the transfer electrode 114 and moreover, the fourth silicon oxide film 112 is formed on the side wall surface of the transfer electrode 114. Thereby, the insulation between the transfer electrode 114 and the light shielding film 113 is kept. Therefore, similarly to the case of the first embodiment, it is possible to decrease the gap between the N-type light-receiving region 103 and the light shielding film 113 and thus, decrease the number of smear signals to be generated.

In the case of the second embodiment, the first silicon oxide film 106 and the silicon nitride film 107 are formed on the substrate 101. However, in the case of the present invention, the same advantage can be obtained by forming only a silicon oxide film. Moreover, it is permitted to form a metallic film or metallic silicide film on the top surface of the transfer electrode 114 in order to decrease a layer resistance. Furthermore, in the case of the present invention, it is not always necessary to form the third silicon oxide film 117 if the photoresist film 116 can be formed at a slit width of 2 μm. In this case, it is possible to etch the second silicon oxide film 115, polycrystalline silicon film, and silicon nitride film 107 in order after patterning the photoresist film 116 into a predetermined shape.

Figure 13A:
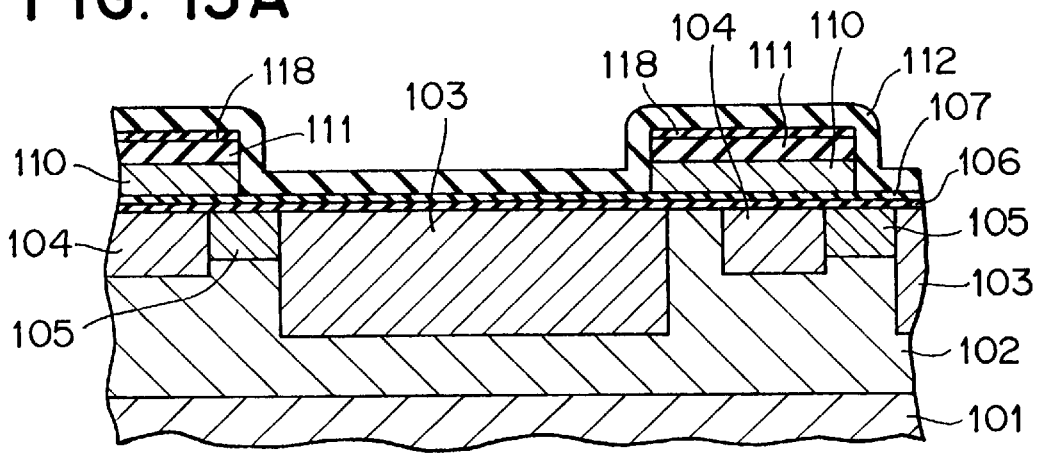
FIGS. 13A to 13C are sectional views showing a method for fabricating the solid-state pickup device of the third embodiment of the present invention in order of fabrication step.
Figure 13B:
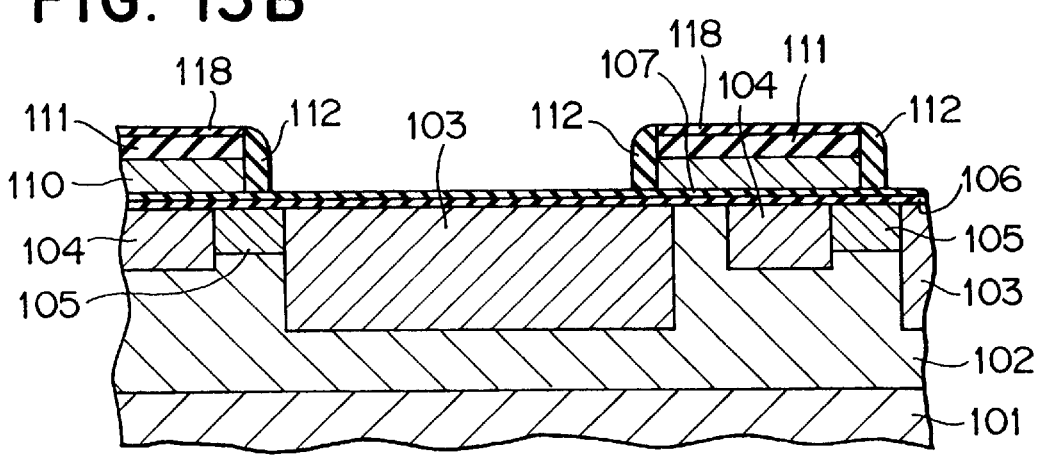
Figure 13C:
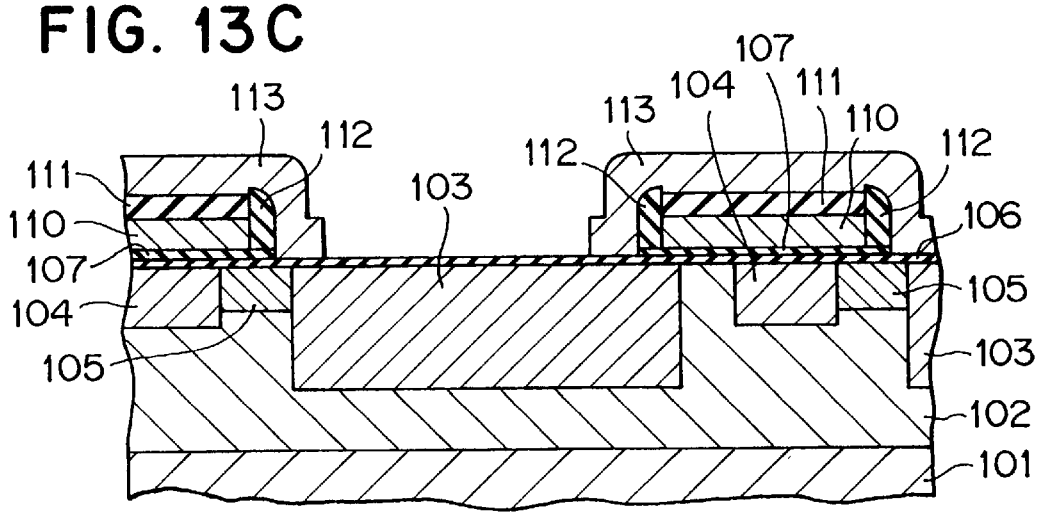

Then, the solid-state pickup device of the third embodiment of the present invention is described below. FIGS. 13A to 13C and FIGS. 14A to 14C are sectional views showing a method for fabricating the solid-state pickup device of the third embodiment of the present invention in order of fabrication step. Because the shape of the top view of the solid-state pickup device of the third embodiment is the same as that of the first embodiment, the top view shown in FIG. 3 is used as a top view of the solid-state pickup device of the third embodiment. Moreover, in the third embodiment shown in FIGS. 13 and 14, a component same as that shown in FIGS. 3 to 5 is provided with the same symbol and its detailed description is omitted. It should be noted that, FIGS. 13A to 13C show sectional views in the direction along the line IV—IV in FIG. 3, and FIGS. 14A to 14C show sectional views in the direction along the line V—V in FIG. 3.

First, similarly to the case of the first embodiment, the second silicon oxide film 109 is formed by forming the first transfer electrode 108 and then thermally oxidizing the surface of the first transfer electrode 108. Then, a polycrystalline silicon film (not shown) and the third silicon oxide film 111 are formed in order on the entire surface of them.

Figure 14A:
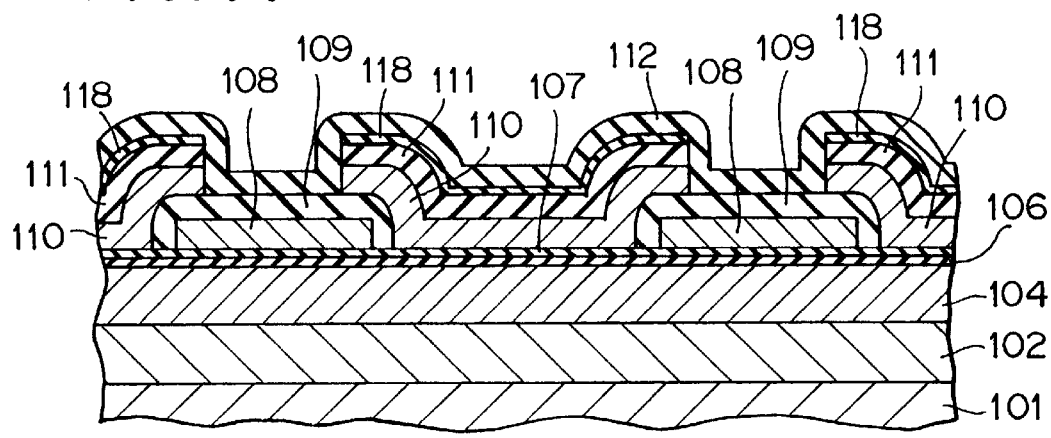
FIGS. 14A to 14C are sectional views showing a method for fabricating the solid-state pickup device of the third embodiment of the present invention in order of fabrication step.

Then, as shown in FIGS. 13A and 14A, a silicon nitride film 118 is deposited on the third silicon oxide film 111 at a thickness of, for example, 20 nm. It is possible to form the silicon nitride film 118 at a thickness equal to the thickness of a silicon nitride film 107. Thereafter, the silicon nitride film 118, third silicon oxide film 111, polycrystalline silicon film, and silicon nitride film 107 are etched by using a photoresist film (not shown) patterned into a predetermined shape as a mask. Thereby, a second transfer electrode 110 made of a polycrystalline silicon film is formed. Thereafter, a fourth silicon oxide film 112 is formed on the entire surface of them at a thickness of, for example, 100 to 500 nm.

Figure 14B:
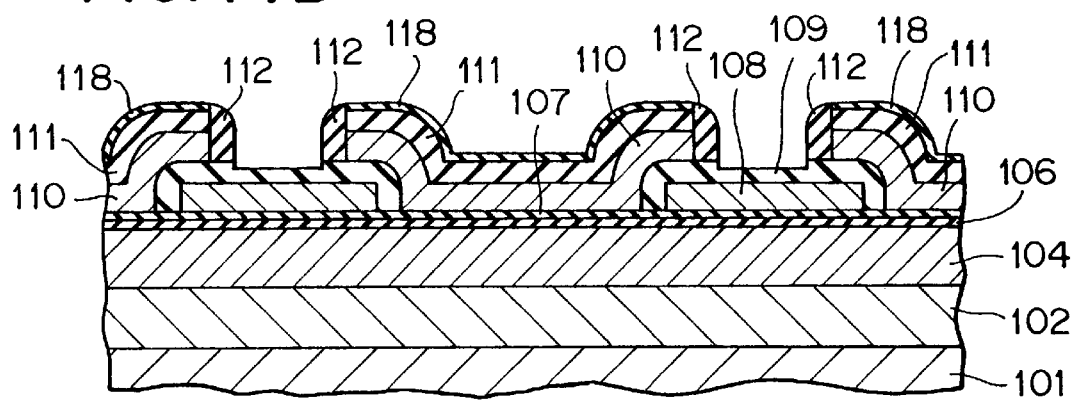

Thereafter, as shown in FIGS. 13B and 14B, the fourth silicon oxide film 112 is etched back. In this case, because the silicon nitride films 107 and 118 are exposed and nitrogen gas is detected in the etching exhaust gas, it is possible to confirm that a predetermined amount of the fourth silicon oxide film 112 is etched. However, it is possible to complete etching when the silicon nitride films 107 and 118 are etched up to approx. a half thickness by considering the fluctuation in etching.

Thereafter, the exposed silicon nitride films 107 and 118 are removed through etching in a hot phosphoric-acid solution. Thereby, only the first silicon oxide film 106 is left on the N-type light-receiving region 103.

Figure 14C:
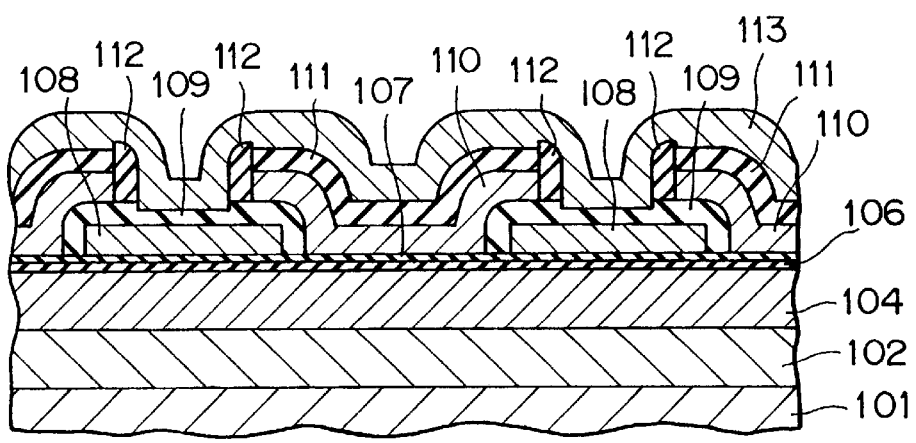

Thereafter, as shown in FIGS. 13C and 14C, the metallic film (not shown) made of aluminum and tungsten and so forth, is deposited on the entire surface of them at a thickness of, for example, 200 nm to 1 μm. Thereafter, the light shielding film 113 is formed by using a photoresist film (not shown) patterned into a predetermined shape as a mask and thereby selectively etching the metallic film. When an insulating capacitance and parasitic capacitance are insufficient because the thickness of the first silicon oxide film 106 on the N-type light-receiving region 3 is too small or the thickness of the first silicon oxide film 106 is insufficient as an etching barrier for etching the light shielding film 113, it is possible to deposit a silicon oxide film on the entire surface at a desired thickness by the CVD process before forming the metallic film. Thereby, it is possible to obtain a CCD-type solid-state pickup device having the structure shown in FIGS. 13 and 14.

The same advantage as that of the first embodiment can be also obtained from the third embodiment thus constituted. Moreover, in the case of the third embodiment, it is possible to confirm the end point of for etching back the fourth silicon oxide film 112 because nitrogen is detected in the etching exhaust gas. Furthermore, when the silicon nitride films 107 and 118 are exposed after etching back the fourth silicon oxide film 112, it is possible to remove the exposed silicon nitride films 107 and 118 by a hot phosphoric-acid solution through etching. Therefore, it is possible to accurately control the thickness of the first silicon oxide film 106 on the N-type light-receiving region 103 and thereby, the fluctuation in smear characteristics of a solid-state pickup device can be reduced. The method of controlling the thickness of a silicon oxide film by etching a silicon nitride film can be also applied to the case of forming the transfer electrode made of a single-layer polycrystalline silicon film shown in the second embodiment.

What is claimed is:

1. A CCD-type solid-state pickup device comprising:

a semiconductor substrate;

a light-receiving section formed at the surface of said semiconductor substrate;

a channel region formed at the surface of said semiconductor substrate separately from said light-receiving section;

a first insulating film formed on said semiconductor substrate;

a plurality of electric-charge transfer electrodes formed above said first insulating film above said channel region, said electric-charge transfer electrodes being arranged along the direction in which electric charges are transferred;

a second insulating film formed on the top surface of said electric-charge transfer electrodes;

a third insulating film formed on the side wall surface of said electric-charge transfer electrodes and said second insulating film; and a light shielding film formed on said second insulating film located above said channel region and on the side wall surface of said third insulating film, the end of said light shielding film extending above said light-receiving section, wherein the distance between the bottom of said light shielding film above said light-receiving section and said light-receiving section is 200 nm or less.

2. The solid-state pickup device according to claim 1, wherein said third insulating film extends above said electric-charge transfer electrodes and above said light-receiving section, the thickness of said third insulating film on said electric-charge transfer electrodes and on said light-receiving sections is smaller than the thickness of said third insulating film on the side wall surface of said second insulating film.

3. A CCD-type solid-state pickup device comprising:

a semiconductor substrate;

a light-receiving section formed at the surface of said semiconductor substrate;

a channel region formed at the surface of said semiconductor substrate separately from said light-receiving section;

a first insulating film formed on said semiconductor substrate;

a first electric-charge transfer electrode selectively formed on said first insulating film;

a second insulating film covering said first electric-charge transfer electrode;

a second electric-charge transfer electrode selectively formed on said first and second insulting films, said channel region being located under said first and second electric-charge transfer electrode;

a third insulating film formed on the top surface of said second electric-charge transfer electrode;

a fourth insulating film formed on the side wall surfaces of said second electric-charge transfer electrode and third insulating film; and a light shielding film formed on said third insulating film located above said channel region and on the side wall surface of said fourth insulating film, the end of said light shielding film extending above said light-receiving section, wherein the distance between the bottom of said light shielding film above said light-receiving section and said light-receiving section is 200 nm or less.

4. The solid-state pickup device according to claim 3, wherein said fourth insulating film extends above said second electric-charge transfer electrode and above said light-receiving section, and the thickness of said fourth insulating film above said second electric-charge transfer electrode and said light-receiving section is smaller than the thickness of said fourth insulating film on the side wall surface of said third insulating film.

5. A CCD-type solid-state pickup device comprising:

a semiconductor substrate;

a light-receiving section formed at the surface of said semiconductor substrate;

a channel region formed at the surface of said semiconductor substrate separately from said light-receiving section;

a first insulating film formed on said semiconductor substrate;

an electric-charge transfer electrode formed on said first insulating film on said channel region;

a light shielding film formed above said channel region;

a second insulating film for insulating said electric-charge transfer electrode from said light shielding film, selectively formed only on the top surface of said electric-charge transfer electrode; and a side-wall insulating film for insulating said electric-charge transfer electrode from said light shielding film, formed on the side wall surface of said electric-charge transfer electrode, wherein the end of said light shielding film extends above said light-receiving section and the distance between the bottom of said light shielding film above said light-receiving section and said light-receiving section is 200 nm or less.

6. The solid-state pickup device according to claim 5, wherein the distance between the bottom of said light shielding film above said light-receiving section and said light-receiving section is 110 nm or less.

7. The solid-state pickup device according to claim 5, wherein said first and second insulating films and said side-wall insulating film are made of a silicon oxide film, respectively.

8. The solid-state pickup device according to claim 5, wherein a silicon nitride film is formed between said first insulating film and said electric-charge transfer electrode.

* * * * *

UNITED STATES PATENT AND TRADEMARK OFFICE
CERTIFICATE OF CORRECTION

PATENT NO. : 6,013,925
DATED : January 11, 2000
INVENTOR(S) : Chihiro Ogawa

It is certified that error appears in the above-identified patent and that said Letters Patent is hereby corrected as shown below:

Column 12,
Line 67, "insulting" should be -- insulating --

Signed and Sealed this

Twenty-third Day of April, 2002

Attest:

JAMES E. ROGAN
Director of the United States Patent and Trademark Office

Attesting Officer